(12) United States Patent
Shen et al.

(10) Patent No.: US 7,882,416 B2
(45) Date of Patent: Feb. 1, 2011

(54) GENERAL AND ALGEBRAIC-CONSTRUCTED CONTENTION-FREE MEMORY MAPPING FOR PARALLEL TURBO DECODING WITH ALGEBRAIC INTERLEAVE ARP (ALMOST REGULAR PERMUTATION) OF ALL POSSIBLE SIZES

(75) Inventors: Ba-Zhong Shen, Irvine, CA (US); Tak K. Lee, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 1006 days.

(21) Appl. No.: 11/704,068

(22) Filed: Feb. 8, 2007

(65) Prior Publication Data

US 2008/0086673 A1    Apr. 10, 2008

Related U.S. Application Data

(60) Provisional application No. 60/850,492, filed on Oct. 10, 2006.

(51) Int. Cl.
*H03M 13/00* (2006.01)

(52) U.S. Cl. .................. 714/755; 714/786; 714/799

(58) Field of Classification Search .......... 714/755, 714/786
See application file for complete search history.

(56) References Cited

U.S. PATENT DOCUMENTS

| | | | |
|---|---|---|---|
| 5,406,570 A | 4/1995 | Berrou et al. | |
| 5,446,747 A | 8/1995 | Berrou | |
| 5,563,897 A | 10/1996 | Pyndiah et al. | |
| 6,065,147 A | 5/2000 | Pyndiah et al. | |
| 6,119,264 A | 9/2000 | Berrou et al. | |
| 6,122,763 A | 9/2000 | Pyndiah et al. | |
| 6,392,572 B1 | 5/2002 | Shiu et al. | |
| 6,715,120 B1 * | 3/2004 | Hladik et al. | 714/755 |
| 6,957,376 B2 * | 10/2005 | Becker et al. | 714/755 |
| 7,185,260 B2 * | 2/2007 | Coombs et al. | 714/755 |
| 7,200,798 B2 * | 4/2007 | Bickerstaff | 714/794 |

(Continued)

FOREIGN PATENT DOCUMENTS

EP    0735696 A2    10/1996

(Continued)

OTHER PUBLICATIONS

A. Tarable, S. Benedetto and G. Montorsi "Mapping Interleaving Laws to Parallel Turbo and LDPC Decoder Architectures," IEEE Transactions on Information Theory, vol. 50, No. 9, pp. 2002-2009, Sep. 2004.

(Continued)

*Primary Examiner*—Esaw T Abraham
(74) *Attorney, Agent, or Firm*—Garlick Harrison & Markison; Shayne X. Short (57) ABSTRACT

General and algebraic-constructed contention-free memory mapping for parallel turbo decoding with algebraic interleave ARP (almost regular permutation) of all possible sizes. A novel means is presented in which contention-free memory mapping is truly achieved in the context of performing parallel decoding of a turbo coded signal. A novel means of performing the contention-free memory mapping is provided to ensure that any one turbo decoder (of a group of parallel arranged turbo decoders) accesses only memory (of a group of parallel arranged memories) at any given time. In doing so, access conflicts between the turbo decoders and the memories are avoided.

20 Claims, 7 Drawing Sheets

U.S. PATENT DOCUMENTS

| | | | | |
|---|---|---|---|---|
| 7,200,799 | B2* | 4/2007 | Wang et al. | 714/795 |
| 7,441,174 | B2* | 10/2008 | Li et al. | 714/755 |
| 7,500,169 | B2* | 3/2009 | Lin | 714/755 |
| 7,530,011 | B2* | 5/2009 | Obuchii et al. | 714/794 |
| 7,549,113 | B2* | 6/2009 | Lin | 714/794 |

FOREIGN PATENT DOCUMENTS

| | | |
|---|---|---|
| EP | 0735696 A3 | 1/1999 |
| FR | 9105278 A1 | 10/1992 |
| KR | 10-2004-0034607 | 4/2004 |
| WO | 02/093755 A1 | 11/2002 |

OTHER PUBLICATIONS

A. Nimbalker, T. E. Fuja, D. J. Costello, Jr., T. K. Blankenship and B. Classon, "Contention-Free Interleavers," IEEE ISIT 2004, Chicago, USA, Jun. 27-Jul. 2, 2004.

C. Berrou, Y. Saouter, C. Douillard, S. Kerouédan, and M. Jézéquel, "Designing good permutations for turbo codes: towards a single model," 2004 IEEE International Conference on Communications (ICC), vol. 1, pp: 341-345, Jun. 20-24, 2004.

France Telecom, GET, Enhancement of Rel. 6 Turbo Code, 3GPP TSG RAN WG1#43, R1-051310, 2005.

3GPP TS 25.212 V6.8.0 (Jun. 2006), 3rd Generation Partnership Project; Technical Specification Group Radio Access Network; Multiplexing and channel coding (FOO) (Release 6) (84 pages).

Libero Dinoi, Alberto Tarable, Sergio Benedetto, "A permutation decomposition based algorithm for the design of prunable interleavers for parallel turbo decoder architectures," Communications, 2006. ICC apos;06. IEEE International Conference on, vol. 3, Issue, Jun. 2006 pp. 1148-1153, Digital Object Identifier 10.1109/ ICC.2006. 254902.

Blankenship, T. Keith, et al., "High-Throughput Turbo Decoding techniques for 4G", in Proc. Int. Conf. 3G Wireless and Beyond, San Francisco, CA, May 2002, pages 137-142.

A. Giulietti, L. van der Perre, and M. Strum, "Parallel turbo coding interleavers: avoiding collisions in accesses to storage elements," Electronics Letters, Feb. 28, 2002, vol. 38 No. 5, pp. 232-234.

Alberto Tarable, S. Benedetto, "Mapping Interleaving Laws to Parallel Turbo Decoder Architectures," IEEE Communications Letters, vol. 8, No. 3, Mar. 2004, pp. 162-164.

Bruno Bougard, Alexandre Giulietti, et al., "A Scalable 8.7nJbit 75.6Mb/s Parallel Concatenated Convolutional (Turbo-) Codec," 2003 IEEE International Solid-State Circuits Conference, 2003, Digest of Technical Papers. Iss Cc. 2003, IEEE International San Francisco, CA, USA, Feb. 9-13, 2003, Piscataway, NJ, USA,IEEE, US, Feb. 9, 2003, pp. 1-10, XP010661601, ISBN: 978-0/7803-7707-3.

Bruno Bougard, Alexandre Giulietti, Liesbet Van der Perre, F. Catthoor, "A Class of Power Efficient VLSI Architectures for High Speed Turbo-Decoding," Globecom '02. 2002 - IEEE Global Telecommunications Conference, Conference Proceedings. Taipei, Taiwan, Nov. 17-21,2002; [IEEE Global Telecommunications Conference], New York, NY: IEEE, US, vol. 1, Nov. 17, 2002, pp. 549-553, XP01 0636011 ISBN: 978-0/7803-7632-8.

Jun Ma, Ali Saidi, "High-Speed Parallel Turbo Decoding for Max-Log Map Kernel Operation Algorithm," Ip.Com Journal, Ip.Com Inc., West Henrietta, NY, US, Mar. 2, 2001, XP013000274, ISSN: 1533-0001,4 pages.

Ke Wan, Qingchen Chen, Pingzhi Fan, "A Novel Parallel Turbo Coding Technique Based on Frame Split and Trellis Terminating," Parallel Ano Distributed Computing, Applications and Technologies, 200 3. PDCAT '2003, Proceedings of the Fourth International Conference on Aug. 27-29, 2003, Piscataway, NJ, USA, IEEE, Aug. 27, 2003, pp. 927-930.

Libero Dinoi, Sergio Benedetto, "Variable-size interleaver design for parallel turbo decoder architectures," IEEE Communications Society Globecom 2004, GLOBECOM '04. IEEE Dallas. TX. USA, Nov. 29 -Dec. 3, 2004, pp. 3108-3112.

Michael J. Thul, Norbert Wehn, "FPGA Implementation of Parallel Turbo-Decoders," SBCCI '04, Sep. 7-11, 2004, Pemambuco, Brazil, pp. 198-203.

Xiang He, Han Wen Luo, HaiBin Zhang, "A Novel Storage Scheme for Parallel Turbo Decoder," Vehicular Technology Conference, 2005, VTC-2005-Fall, 2005 IEEE 62ND Dallas, TX, USA Sep. 25-28, 2005, Piscataway, NJ, USA, IEEE, vol. 3, Sep. 25, 2005, pp. 1950-1954.

Zhiyong He, Sebastien Roy, and Paul Fortier, "High-Speed And Low-Power Design Of Power Design Of Parallel Turbo Decoder," Circuits And Systems, 2005, ISCAS 2005, IEEE International Symposium On Kobe, Japan May 23-26, 2005, pp. 6018-6021.

* cited by examiner

Fig. 7 ically, it relates to parallel decoding of sig-
US 7,882,416 B2

GENERAL AND ALGEBRAIC-CONSTRUCTED CONTENTION-FREE MEMORY MAPPING FOR PARALLEL TURBO DECODING WITH ALGEBRAIC INTERLEAVE ARP (ALMOST REGULAR PERMUTATION) OF ALL POSSIBLE SIZES

CROSS REFERENCE TO RELATED PATENTS/PATENT APPLICATIONS

Provisional Priority Claims

The present U.S. Utility Patent Application claims priority pursuant to 35 U.S.C. § 119(e) to the following U.S. Provisional patent application which is hereby incorporated herein by reference in its entirety and made part of the present U.S. Utility Patent Application for all purposes:

U.S. Provisional application Ser. No. 60/850,492, entitled "General and algebraic-constructed contention-free memory mapping for parallel turbo decoding with algebraic interleave ARP (almost regular permutation) of all possible sizes," filed Oct. 10, 2006, pending.

BACKGROUND OF THE INVENTION

Technical Field of the Invention

The invention relates generally to communication systems; and, more particularly, it relates to parallel decoding of signals within such communication systems employing turbo codes.

DESCRIPTION OF RELATED ART

Data communication systems have been under continual development for many years. One such type of communication system that has been of significant interest lately is a communication system that employs iterative error correction codes. One type of communication system that has received interest in recent years has been one which employs turbo codes (one type of iterative error correcting code). Communications systems with iterative codes are often able to achieve lower bit error rates (BER) than alternative codes for a given signal to noise ratio (SNR).

A continual and primary directive in this area of development has been to try continually to lower the SNR required to achieve a given BER within a communication system. The ideal goal has been to try to reach Shannon's limit in a communication channel. Shannon's limit may be viewed as being the data rate to be used in a communication channel, having a particular SNR, that achieves error free transmission through the communication channel. In other words, the Shannon limit is the theoretical bound for channel capacity for a given modulation and code rate.

The use of turbo codes providing such relatively lower error rates, while operating at relatively low data throughput rates, has largely been in the context of communication systems having a large degree of noise within the communication channel and where substantially error free communication is held at the highest premium. Some of the earliest application arenas for turbo coding were space related where accurate (i.e., ideally error free) communication is often deemed an essential design criterion. The direction of development then moved towards developing terrestrial-applicable and consumer-related applications. Still, based on the heritage of space related application, the focus of effort in the turbo coding environment then continued to be achieving relatively lower error floors, and not specifically towards reaching higher throughput.

More recently, focus in the art has been towards developing turbo coding, and variants thereof, that are operable to support higher amounts of throughput while still preserving the relatively low error floors offered within the turbo code context.

Generally speaking, within the context of communication systems that employ turbo codes, there is a first communication device at one end of a communication channel with encoder capability and second communication device at the other end of the communication channel with decoder capability. In many instances, one or both of these two communication devices includes encoder and decoder capability (e.g., within a bi-directional communication system).

BRIEF SUMMARY OF THE INVENTION

The present invention is directed to apparatus and methods of operation that are further described in the following Brief Description of the Several Views of the Drawings, the Detailed Description of the Invention, and the claims. Other features and advantages of the present invention will become apparent from the following detailed description of the invention made with reference to the accompanying drawings.

DETAILED DESCRIPTION OF THE INVENTION

Many communication systems incorporate the use of a turbo code. When performing decoding of turbo coded signals, there are a variety of means to do so. One means of decoding turbo coded signals is to perform parallel decoding such that a number of turbo decoders are arranged in parallel. In addition, such a parallel decoding approach often involves a number of memories that are also arranged in parallel.

However, there is a challenge to ensure that there are no read and write conflicts between the various turbo decoders and the various memories when performing this parallel decoding approach. When the conflicts during memory access are avoided, then that operation is referred to as contention-free. A novel means is presented herein in which contention-free memory mapping is truly achieved in the context of performing parallel decoding of a turbo coded signal. A novel means of performing the contention-free memory mapping is provided to ensure that any one turbo decoder (of a group of parallel arranged turbo decoders) accesses only memory (of a group of parallel arranged memories) at any given time. In doing so, access conflicts between the turbo decoders and the memories are avoided.

While there are many potential applications that can employ turbo codes, means are presented herein that can be applied to the 3GPP channel code to support an arbitrary number of information bits. Some examples of the number of bits that can be supported using the various aspects of the invention presented herein are 40 to 5114 for WCDMA and HSDPA and more for LTE.

Additional information regarding the UTRA-UTRAN Long Term Evolution (LTE) and 3GPP System Architecture Evolution (SAE) can be found at that organization's publicly available Internet web site.

Within the channel coding system in 3GPP LTE, there is a need and desire to supply and provide for a wide range of block sizes (i.e., turbo code block lengths). Furthermore, turbo decoding of this system needs to be implemented using a parallel decoding arrangement because of the very high data throughput and large block size desired. The parallel decoding requires the contention-free memory accessing (i.e., any one turbo decoder (of a group of parallel arranged turbo decoders) accesses only memory (of a group of parallel arranged memories) at any given time). In reference [1] as depicted below, the authors therein assert that there always exists a contention-free memory mapping for parallel decoding of any degree.

Turbo coding was suggested for 3GPP LTE channel coding. For this coding system, the algebraic interleave referred to as the "almost regular permutation (ARP)" in reference [3] is considered as one of the candidates. In reference [3] and reference [4], a memory mapping for parallel decoding is mentioned. However, as shown herein, that particular memory mapping is not actually contention-free for any block length, but rather only for a block size L satisfying $\gcd(L,C)=1$ where C is the degree of parallelism (i.e., the total number of turbo decoders implemented in the parallel arrangement). In fact, the memory mappings for all the examples in reference [3] and reference [4] are not contention-free.

Herein, it is also shown that the memory mapping defined in reference [2] is also not contention-free for ARP except for the case where $C^2$ is a factor of the block size (i.e., the block length, L). However, as mentioned above, the coding system in 3GPP LTE needs to be adaptable to and operable for a wide variety of block sizes. Therefore, a new memory mapping, that actually is a contention-free memory mapping, is required for all types of block sizes.

Herein, a general and algebraic contention-free memory mapping for ARP is presented that is adaptable to turbo coded signals having any arbitrary block size (i.e., any block length). The proof of the contention-free property of the proposed memory mapping is also given in the APPENDIX. With this contention-free mapping, parallel decoding of turbo codes with interleave ARP of all possible block sizes can be performed.

Figure 1:
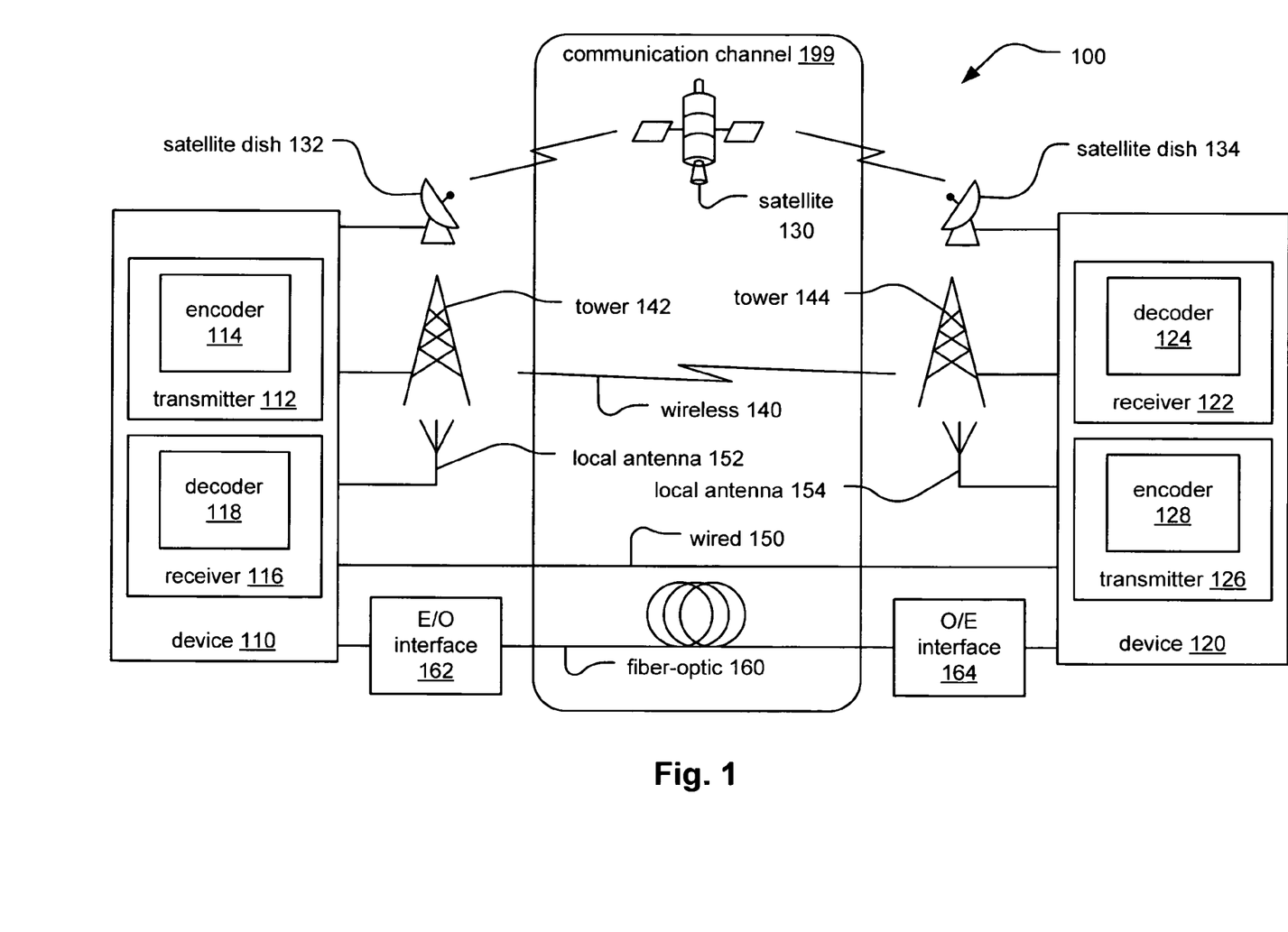
FIG. 1 illustrates an embodiment of a communication system.

The goal of digital communications systems is to transmit digital data from one location, or subsystem, to another either error free or with an acceptably low error rate. As shown in FIG. 1, data may be transmitted over a variety of communications channels in a wide variety of communication systems: magnetic media, wired, wireless, fiber, copper, and other types of media as well.

FIG. 1 is a diagram illustrating an embodiment of a communication system 100.

Referring to FIG. 1, this embodiment of a communication system 100 is a communication channel 199 that communicatively couples a communication device 110 (including a transmitter 112 having an encoder 114 and including a receiver 116 having a decoder 118) situated at one end of the communication channel 199 to another communication device 120 (including a transmitter 126 having an encoder 128 and including a receiver 122 having a decoder 124) at the other end of the communication channel 199. In some embodiments, either of the communication devices 110 and 120 may only include a transmitter or a receiver. There are several different types of media by which the communication channel 199 may be implemented (e.g., a satellite communication channel 130 using satellite dishes 132 and 134, a wireless communication channel 140 using towers 142 and 144 and/or local antennae 152 and 154, a wired communication channel 150, and/or a fiber-optic communication channel 160 using electrical to optical (E/O) interface 162 and optical to electrical (O/E) interface 164)). In addition, more than one type of media may be implemented and interfaced together thereby forming the communication channel 199.

To reduce transmission errors that may undesirably be incurred within a communication system, error correction and channel coding schemes are often employed. Generally, these error correction and channel coding schemes involve the use of an encoder at the transmitter and a decoder at the receiver.

Contention-free Memory Mapping

We recall the definition from reference [1]. Consider an index set $I=\{0,1,\ldots,L-1\}$ of L integers. Suppose $L=CM$ and let $E_0,\ldots,E_{M-1}$ be a partition of the set I such that every set $E_i$ has C elements. Then parallel decoding of degree C (i.e., a parallel arrangement of turbo decoders including C turbo decoders) can be considered as follows.

At the i-th cycle the C processors work in parallel on C elements of the index subset $E_i$. Let $\hat{E}_0,\ldots,\hat{E}_{M-1}$ be another partition of the given index set with $\|\hat{E}_k\|=C$, $k=0,\ldots,M-1$. Then a map $\mathcal{M}$ defined from the index set I to the set $Z_C=\{0,1,\ldots,C-1\}$ is a contention-free mapping for the two partitions if it satisfy the following condition: for every $j,j' \in \{0,\ldots,L-1\}, j \neq j'$ $$j,j' \in E_i \Rightarrow \mathcal{M}(j) \neq \mathcal{M}(j') \text{ and } j,j' \in \hat{E}_i \Rightarrow \mathcal{M}(j) \neq \mathcal{M}(j'). \quad \text{(EQ-1)}$$

In other words, the integers belonging to the same subset in either partition are mapped to different bins.

When this definition applies to turbo code, the set I is the set of the index of the coded symbols (a symbol is combined with information bits and redundancy bits) and one partition is on original index sequence and another one is the interleaved index sequence.

Parallel decoding of Turbo code (reference [1]): Let $\pi$ be an interleave. The partition $E_0 \cup \ldots \cup E_{M-1}$ and partition $\hat{E}_0 \cup \ldots \cup \hat{E}_{M-1}$ have to be defined by $$E_i = \{jM+i, j=0,\ldots,C-1\} \text{ and } \hat{E}_i = \{\pi(jM+i), j=0,\ldots,C-1\}, i=0,\ldots,M-1$$

Therefore, the j-th processor works on the symbol sequence with the indexes $jM, jM+1, \ldots, (j+1)M-1$ (i.e. a consecutive sequence) or the interleaved sequence with the indexes $\pi(jM), \pi(jM+1), \ldots, \pi((j+1)M-1)$.

In reference [2], a contention-free memory mapping is given for some turbo code interleave $\pi$, which maps $\pi(jk+i)$ to $\lfloor \pi(jk+i)/k \rfloor$ and maps $\pi^{-1}(jk+i)$ to $\lfloor \pi^{-1}(jk+i)/k \rfloor$. In fact, the definition is equivalent to the mapping $$\mathcal{M}:i \mapsto \lfloor i/k \rfloor \quad \text{(EQ-2)}$$

Figure 2:
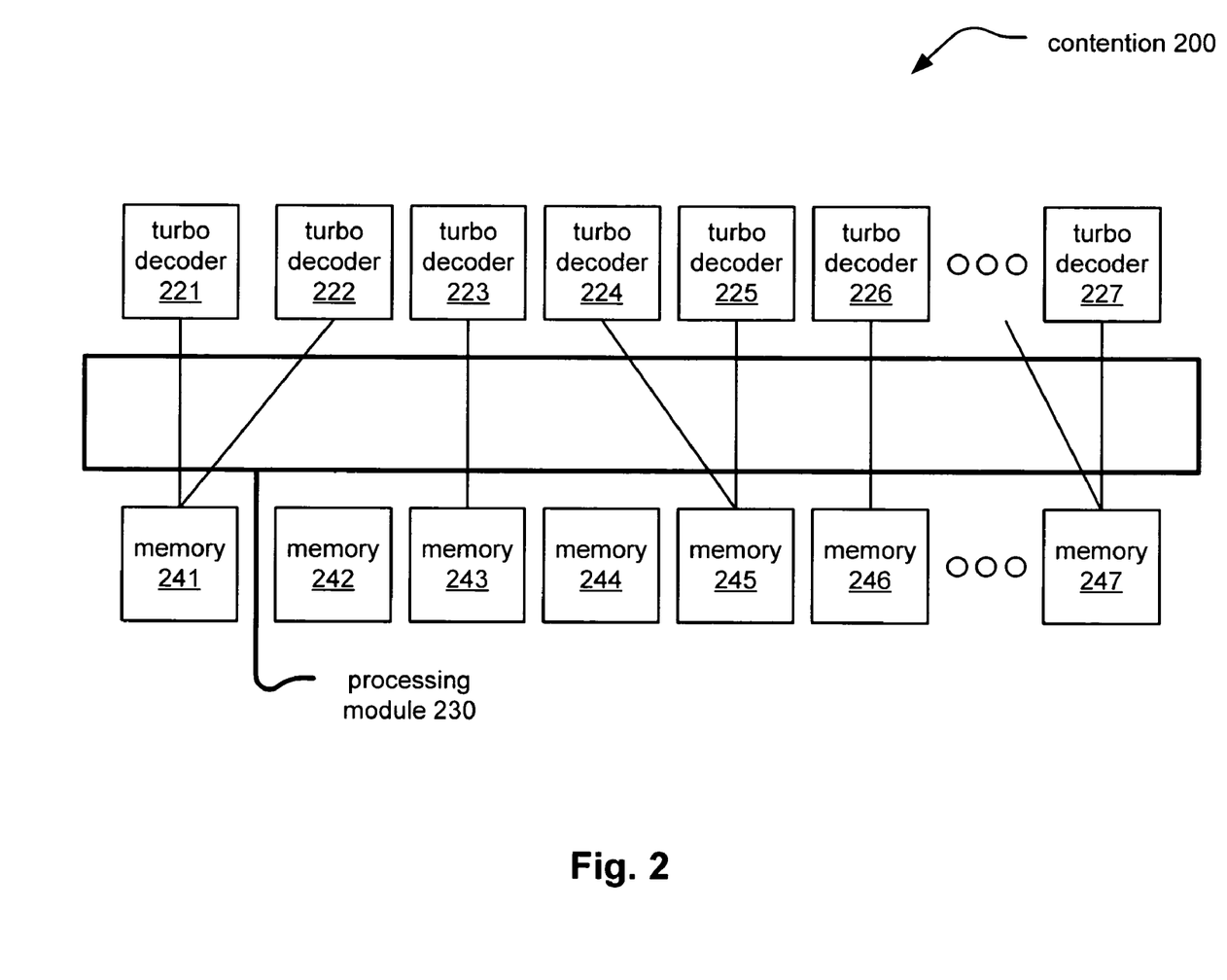
FIG. 2 illustrates an embodiment of a turbo decoder that performs parallel decoding in which contention occurs because of a lack of contention-free memory mapping between turbo decoders and memories.

FIG. 2 illustrates an embodiment of a turbo decoder 200 that performs parallel decoding in which contention occurs because of a lack of contention-free memory mapping between turbo decoders and memories.

This turbo decoder 200 includes a plurality of turbo decoders 221-227, a plurality of memories 241-247, and a processing module 230 that is operable to perform the memory mapping between the plurality of turbo decoders 221-227 and the plurality of memories 241-247. As can be seen, more than one turbo decoders tries to access a same memory at a given time. Specifically, turbo decoder 221 and turbo decoder 222 are trying to access memory 241, and turbo decoder 224 and turbo decoder 225 are trying to access memory 245. Also, turbo decoder 227 and another turbo decoder (included in the region as shown by the ellipsis . . .) are trying to access memory 247. This creates conflicts and incurs deleterious performance.

Figure 3:
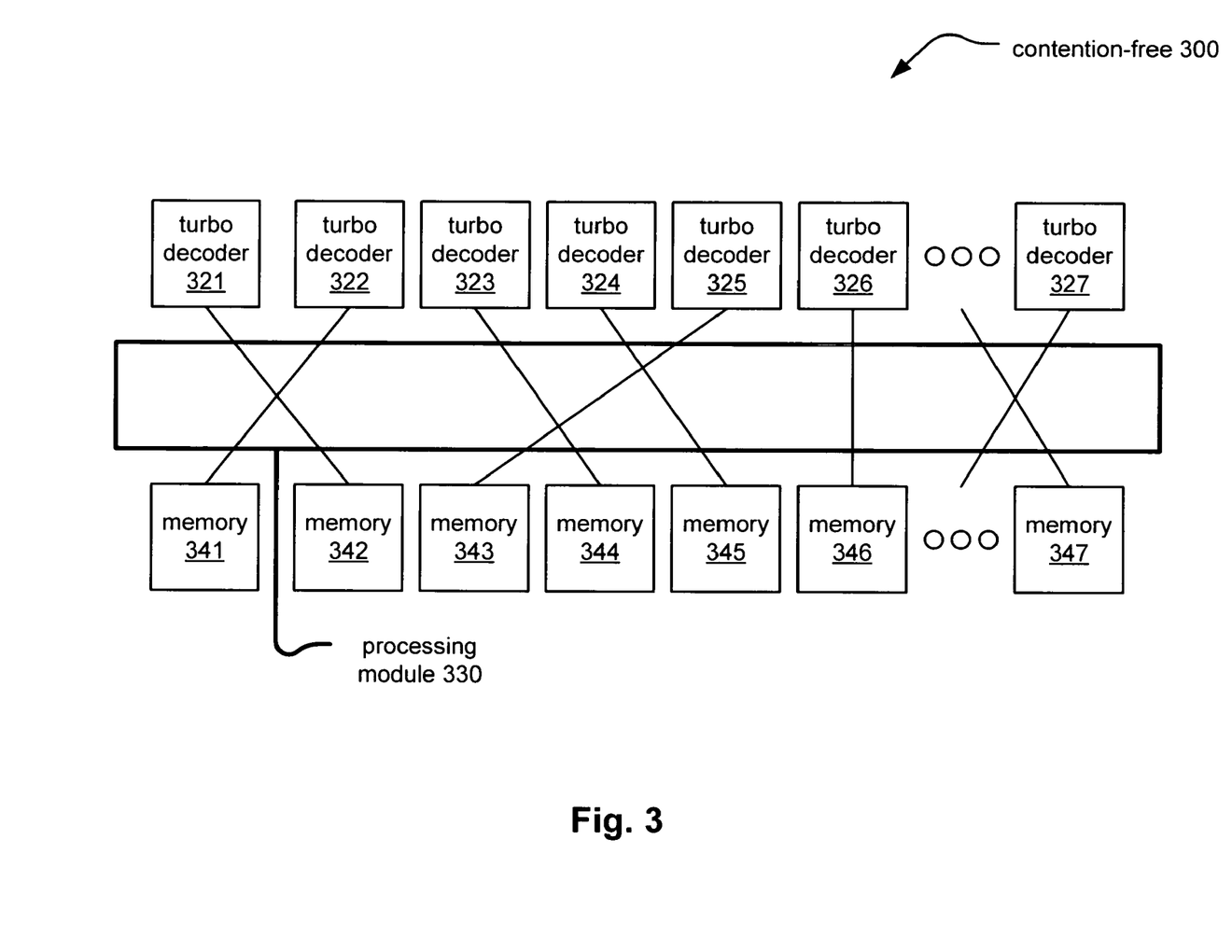
FIG. 3 illustrates an embodiment of a turbo decoder that performs parallel decoding in which no contention occurs because of contention-free memory mapping between turbo decoders and memories.

FIG. 3 illustrates an embodiment of a turbo decoder 300 that performs parallel decoding in which no contention occurs because of contention-free memory mapping between turbo decoders and memories.

This turbo decoder 300 includes a plurality of turbo decoders 321-327, a plurality of memories 341-347, and a processing module 330 that is operable to perform contention-free memory mapping between the plurality of turbo decoders 321-327 and the plurality of memories 341-347. As can be seen, only one turbo decoder accesses any one memory at a given time. This is a truly contention-free memory mapping between the plurality of turbo decoders 321-327 and the plurality of memories 341-347.

Figure 4:
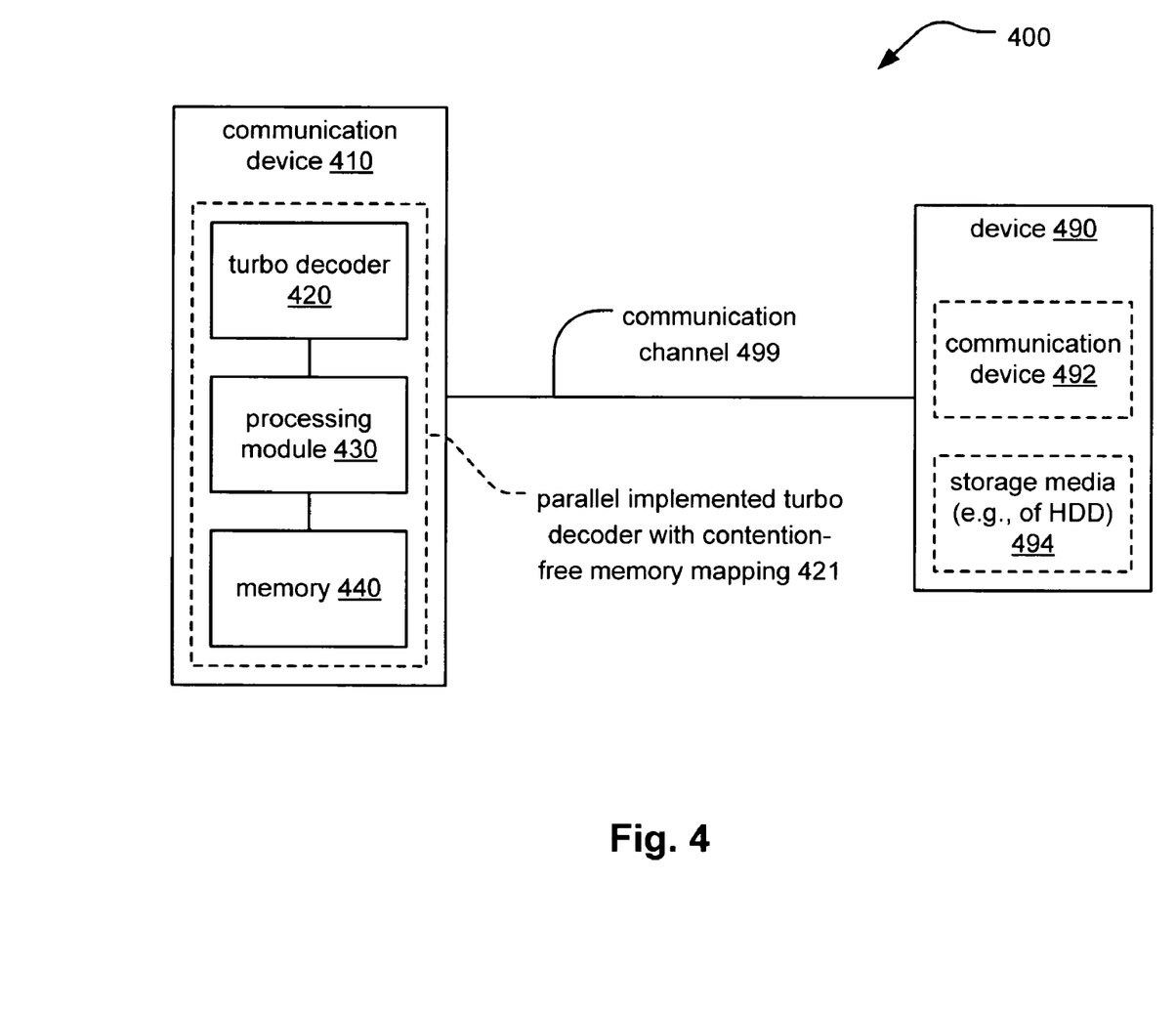
FIG. 4 and FIG. 5 illustrate other embodiments of a communication system.
Figure 5:
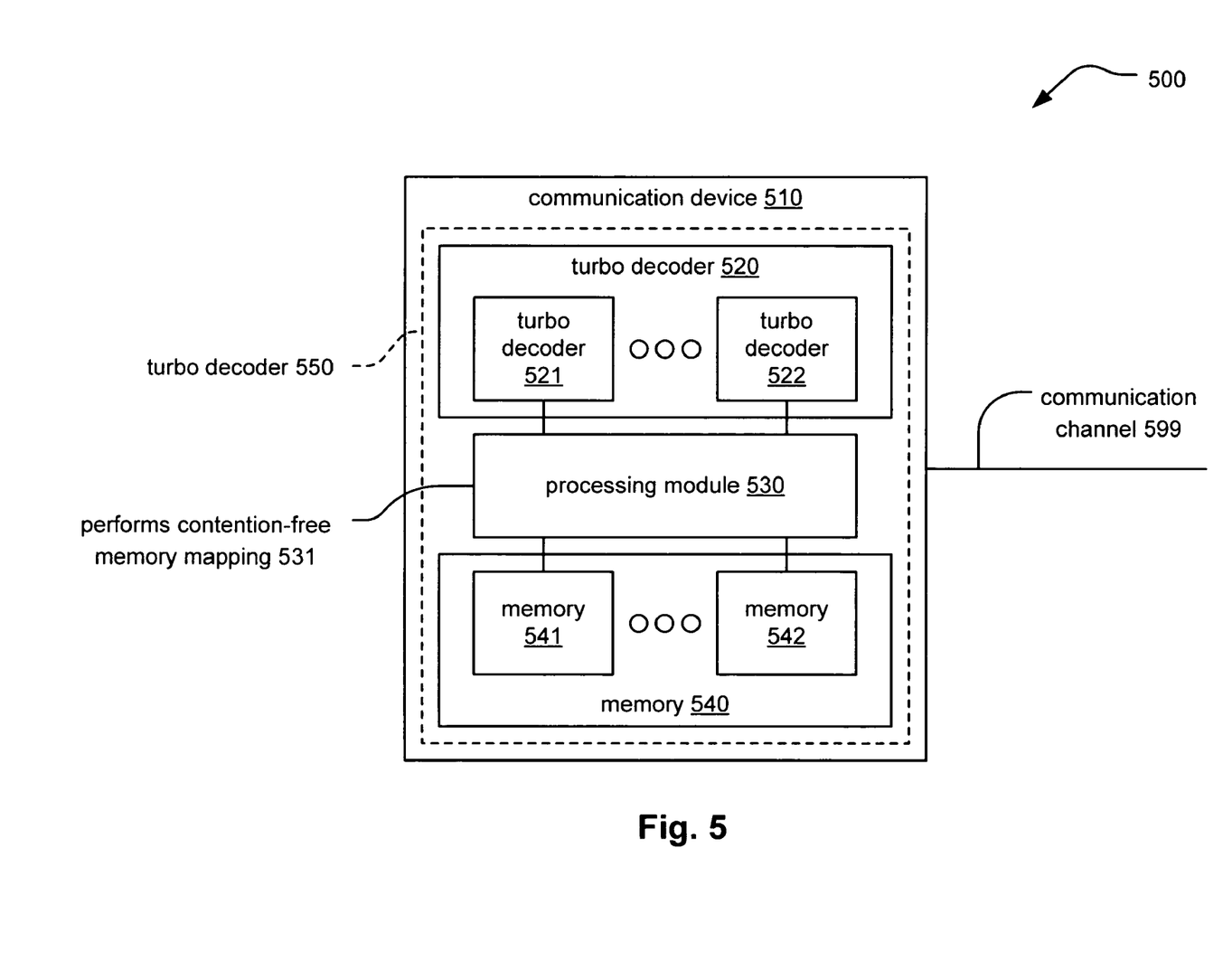
Figure 6A:
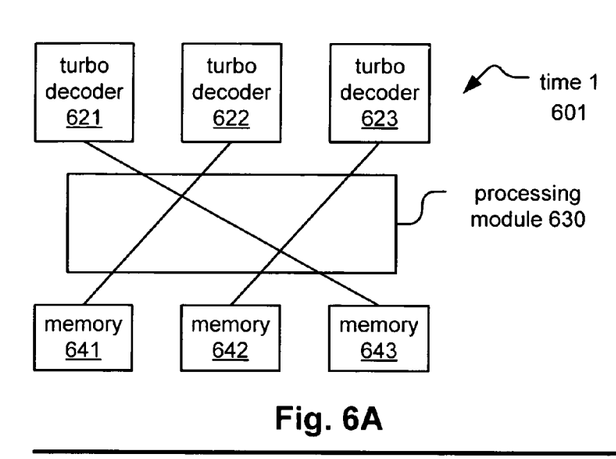
FIG. 6A, FIG. 6B, FIG. 6C, and FIG. 6D illustrates various, successive contention-free memory mappings between turbo decoders and memories.
Figure 6B:
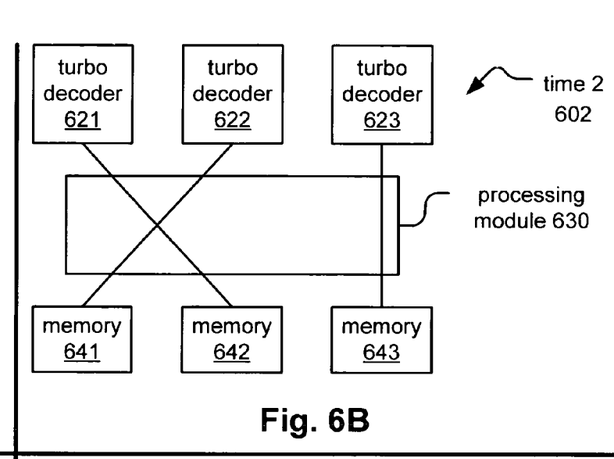
Figure 6C:
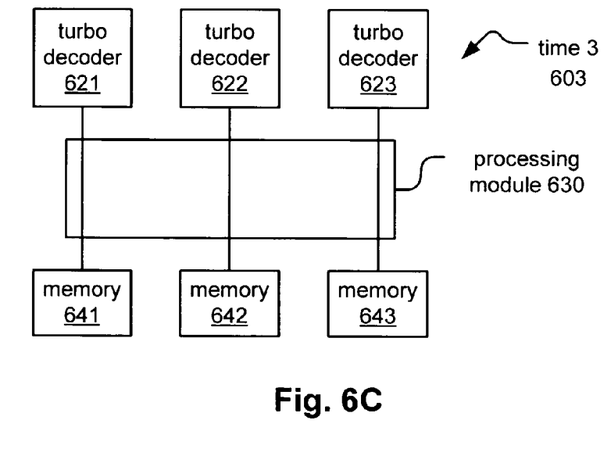
Figure 6D:
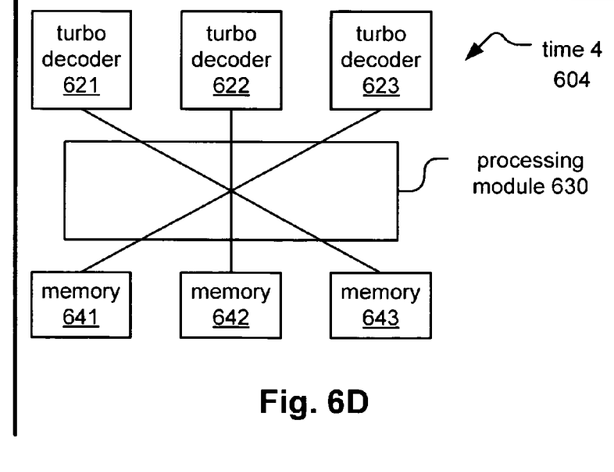

FIG. 4 and FIG. 5 illustrate other embodiments of a communication system.

Referring to the communication system 400 of FIG. 4, the communication system 400 includes a communication device 410 that is coupled to another device 490 via a communication channel 499. The communication device 410 includes a decoder 421 that is implemented as a parallel implemented turbo decoder that is operable to employ contention-free memory mapping.

The other device 490 to which the communication device 410 is coupled via the communication channel 499 can be another communication device 492, a storage media 494 (e.g., such as within the context of a hard disk drive (HDD)), or any other type of device that is capable to receive and/or transmit signals. In some embodiments, the communication channel 499 is a bi-directional communication channel that is operable to perform transmission of a first signal during a first time and receiving of a second signal during a second time. If desired, full duplex communication may also be employed, in which each of the communication device 410 and the device 490 can be transmitted and/or receiving from one another simultaneously.

The decoder 421 of the communication device 410 includes a turbo decoder 420, a processing module 430, and a memory 440. The processing module 430 can be coupled to the memory 440 so that the memory is operable to store operational instructions that enable to the processing module 430 to perform certain functions.

Generally speaking, the processing module 430 is operable to perform contention-free memory mapping between the turbo decoder 420 and the memory 440 during iterative decoding processing.

It is also noted that the processing module 430 can be implemented strictly as circuitry. Alternatively, the processing module 430 can be implemented strictly in software such as can be employed within a digital signal processor (DSP) or similar type device. In even another embodiment, the processing module 430 can be implemented as a combination of hardware and software as well without departing from the scope and spirit of the invention.

In even other embodiments, the processing module 430 can be implemented using a shared processing device, individual processing devices, or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The processing module 430 can be coupled to the memory 440 that is operable to store operational instructions that enable to processing module 430 to perform the appropriate contention-free memory mapping between the turbo decoder 420 and the memory 440.

Such a memory 440 may be a single memory device or a plurality of memory devices. Such a memory 440 may be a read-only memory, random access memory, volatile memory, non-volatile memory, static memory, dynamic memory, flash memory, and/or any device that stores digital information. Note that when the processing module 430 implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry.

Referring to the communication system 500 of FIG. 5, this embodiment is somewhat analogous to the previous embodiment. The communication system 500 includes a communication device 510 that can be coupled to another device via a communication channel 599. The communication device 510 includes a turbo decoder 520 that is itself composed of a plurality of turbo decoders 521-522. The communication device 510 also includes a memory 540 that is itself composed of a plurality of memories 541-542. A processing module 530 is operable to perform contention-free memory mapping between the plurality of turbo decoders 521-522 and the plurality of memories 541-542 during iterative decoding processing of a turbo coded signal.

FIG. 6A, FIG. 6B, FIG. 6C, and FIG. 6D illustrates various, successive contention-free memory mappings between turbo decoders and memories. These 4 diagrams should be considered in conjunction with one another.

A communication device includes a turbo decoder that is itself composed of a plurality of turbo decoders 621, 622, and 623. Such a communication device also includes a memory that is itself composed of a plurality of memories 641, 642, and 643. A processing module 630 is operable to perform contention-free memory mapping between the plurality of turbo decoders 621, 622, and 623 and the plurality of memories 641, 642, and 643 during iterative decoding processing of a turbo coded signal.

At any given time, the processing module 630 is operable to ensure that only one turbo decoder accesses a given memory at a given time. For example, a processing module 630 is operable to perform a first contention-free memory mapping at a time 1, as shown by reference numeral 601. The processing module 630 is operable to perform a second contention-free memory mapping at a time 2, as shown by reference numeral 602. The processing module 630 is operable to perform a second contention-free memory mapping at a time 3, as shown by reference numeral 603. The processing module 630 is operable to perform a second contention-free memory mapping at a time 4, as shown by reference numeral

604. As can be seen, only one turbo decoder is connected to any one memory at any given time in each of these 4 diagrams.

As can be seen, the contention-free memory mapping between the turbo decoders 621, 622, and 623 and the plurality of memories 641, 642, and 643 changes as a function of time during iterative decoding processing of a turbo coded signal.

Almost Regular Permutation (ARP)

In reference [3] a regular permutation is defined as circular permutation, based on congruence properties. Circular permutation $\pi$, for blocks having L information symbols, is devised as follows. The data are read out such that the j-th datum read was written at the position i given by:

$$i = \pi(j) = jP \bmod L \quad \text{(EQ-3)}$$

where the skip value P is an integer, prime with L. The almost regular permutation (ARP) of size L=CM (i.e. C is a divider of L) is introduced in reference [3] defined by modify (EQ-3) to $$i = \pi(j) = jP + A(j \bmod C)P + B(j \bmod C) \bmod L \quad \text{(EQ-4)}$$

To insure the function defined in (EQ-4) is a permutation (i.e. one to one and on to), reference [3] takes $A(j)P+B(j)=C(\alpha[j \bmod C]P+\beta(j \bmod C))$.

R1-051310 reference [4] gave an example of (EQ-4) for the period C=4 with the following $$i = \pi(j) = jP + D(\bmod 4) + 3 \bmod L \quad \text{(EQ-5)}$$

where the function D is defined by:

$$D(j \bmod 4) = \begin{cases} 0 & \text{if } j = 0 \bmod 4 \\ Q_1 & \text{if } j = 1 \bmod 4 \\ 4P + Q_2 & \text{if } j = 2 \bmod 4 \\ 4P + Q_3 & \text{if } j = 3 \bmod 4 \end{cases}$$

However, as pointed out in reference [3] if $Q_1, Q_2$ and $Q_3$ is not a multiple of 4, the function in (EQ-5) may not be a permutation. In fact the Q's in examples given in reference [4] are all chosen to be multiple of 4.

Contradictions on contention-free memory mapping given in reference [3] and reference [4]

Consider ARP $\pi$ defined in (EQ-4) and (EQ-5) with period C=4. It is easy to see that $\pi(4l) \bmod 4$, $\pi(4l+1) \bmod 4$, $\pi(4l+2) \bmod 4$, $\pi(4l+3) \bmod 4$ are different. With this conclusion reference [3] and reference [4] suggest the following parallel decoding that will have contention-free. "the circle can be evenly divided into four parts, or quadrants, four Soft-in/Soft-Out (SISO) (forward or backward) processors are assigned to the four quadrants of the circle under process. At the same time, the four units deal with data that are located at places corresponding to the four possible congruencies. For each clock period, the processors will change quadrants through cyclic shifts and two processors will therefore never access the same quadrant."

According to the claim stated in reference [3] and reference [4], the memory mapping defined in the papers is $$\mathcal{M}: i | \to i \bmod C \quad \text{(EQ-6)}$$

where C is the period and C=4 in reference [4].

Based on the discussion in Section 3 and in reference [1], parallel turbo decoding of degree C. has to have the following index partitions:

$$E_i = \{jM + i, j = 0, \ldots, C-1\} \text{ and}$$

$$\hat{E}_i = \{\pi(jM+i), j=0, \ldots, C-1\}, i=0, \ldots, M-1.$$

That is to say at the i-th clock, the C parallel processors should work on the symbols with indexes $i, i+M, \ldots, i+(C-1)M$. However, according to reference [3] and reference [4], these C indexes should have different congruencies mod C, i.e. the C elements $$i \bmod C, (i+M) \bmod C, \ldots, [i+(C-1)m] \bmod C$$

have to be distinct. This is not true when $\gcd(M,C) \neq 1$. In fact, when $\gcd(M,C) = \alpha > 1$, we have $C = \alpha C'$ with $C' < C$. Thus $C'M \bmod C = 0$. Therefore $\mathcal{M}(i) = \mathcal{M}(i+C'M)$, which contradicts the contention-free definition and the claim given in [3] and [4]. The examples given in reference [3] with L=5472=12*456 (C=12) and L=408=4*102 (C=4) and examples given in reference [4] with L=320=4*80 (C=4) and L=640=4*160 (C=4) are all belong to this non-contention-free memory mapping. Therefore, the claim in reference [3] and reference [4] is not true for many cases, except the case where $\gcd(M,C)=1$.

Consider the following memory mapping given in reference [2].

$$\mathcal{M}: i | \to \left\lfloor \frac{i}{M} \right\rfloor$$

One can prove that the mapping works for ARP only on the case $\gcd(M,C)=C$.

Example 1 (reference [3]) L=408=4* 102 (C=4) with gcd (4,102)=2, i.e. M=102.

Using the interleave $\pi$ given in reference [3], the following is provided:

$$\pi(0)=0, \pi(M)=74, \pi(2M)=204, \pi(3M)=278$$

This gives $$\left\lfloor \frac{\pi(0)}{M} \right\rfloor = 0, \left\lfloor \frac{\pi(M)}{M} \right\rfloor = 0, \left\lfloor \frac{\pi(2M)}{M} \right\rfloor = 2, \left\lfloor \frac{\pi(3M)}{M} \right\rfloor = 2.$$

Therefore, the mapping is not contention-free.

Example 2 Let L=804, C=4, P=43, Q1=24, Q2=12 and Q3=4 and interleave $\pi$ is given in (EQ-5) (i.e. based on reference [4]). Then M=201 i.e. gcd(M,C)=1. However, $$\pi(1)=70, \pi(M+1)=29, \pi(2M+1)=624, \pi(3M+1)=247$$

This gives $$\left\lfloor \frac{\pi(1)}{M} \right\rfloor = 0, \left\lfloor \frac{\pi(M+1)}{M} \right\rfloor = 0, \left\lfloor \frac{\pi(2M+1)}{M} \right\rfloor = 3, \left\lfloor \frac{\pi(3M+1)}{M} \right\rfloor = 1.$$

Therefore, the mapping is not contention-free.

Generalization of ARP

Before giving a general contention-free memory mapping for all size of ARP, the ARP definition as provided in reference [3] and reference [4] is combined and generalized below.

Consider interleave a size L information symbols. Let C be a divider of L and let P be an integer prime with L. Suppose L=CM and denote m=M mod C. Let A(x) and B(x) be functions defined on the set $\{0, \ldots, C-1\}$ such that $$(A(x)P+B(x)) \bmod C = (A(y)P+B(y)) \bmod C \text{ if } x=y \bmod m \quad \text{(EQ-7)}$$

Furthermore, let $\theta \in \{0, \ldots, C-1\}$. An ARP $\pi$ of blocks size L is defined as follows by $$\pi(j)=Pj+A(j \bmod C)P+B(j \bmod C)+\theta \bmod L, j \in \{0, \ldots, L-1\} \quad \text{(EQ-8)}$$

Moreover, to insure $\pi$ is a permutation, the condition $\pi(j) \neq \pi(j')$ when $j \neq j'$ must be satisfied. In fact, as pointed out in reference [3], by taking $A(v)=C\alpha(v)$, $B(v)=C\beta(v)$ (as defined in reference [3]), one can show that $\pi$ is indeed a permutation.

Contention-free Mapping for ARP of Arbitrary Size

Let $\pi$ be an ARP interleave of size $L=CM$ defined in (EQ-7) with $\gcd(P,L)=\gcd(P,C)=1$. According to the discussion in Section 3 (or reference [1]), to have parallel turbo decoding of degree C. the indexes set of information sequence and the indexes set of the interleaved sequence have to be partitioned as $$E_i=\{jM+i | j=0, \ldots, C-1\}, \hat{E}_i=\{\pi(jM+i) | j=0, \ldots, C-1\} \quad \text{(EQ-9)}$$

This means at the i-th time clock the C processors will update the soft estimate of the information symbols with the indexes in $E_i$ (or $\hat{E}_i$) in parallel.

Denote $Z_C=\{i \bmod C | i \in Z\}$ where Z is the integer ring and denote $m=M \bmod C$. The order of m in $Z_C$, $\text{ord}_C(m)$, is defined to be an integer q such that $qm \bmod C=0$ but $am \bmod C \neq 0$ for any $0<\alpha<q$. Since $qM \bmod C = qm \bmod C = 0$, q is also referred to as the order of M and denoted to be $\text{ord}_C(M)$. It is obvious that $q | C$. Let $C_f$ be the factor of C such that $C=\text{ord}_C(m)C_f$. In the following when there is no confusion, q is denoted as $\text{ord}_C(M)=\text{ord}_C(m)$. There is a further partition of $E_i$ and $\hat{E}_i$ to $$E_i = \bigcup_{s=0}^{C_f-1} E_{i,s} \text{ and } \hat{E}_i = \bigcup_{s=0}^{C_f-1} \hat{E}_{i,s},$$

where $$E_{i,s}=\{(sq+r)M+i | r=0, \ldots, q-1\} \text{ and}$$

$$\hat{E}_{i,s}=\{\pi[(sq+r)M+i] | r=0, \ldots, q-1\} \quad \text{(EQ-10)}$$

Definition 1 Let $\eta_0, \eta_1, \ldots, \eta_{C_f-1} \in Z_C$ such that $\{\eta_0, \ldots, \eta_{C_f-1}\}=\{0,1,\ldots,C_f-1\}$. Define the memory mapping $\mathcal{M}$ from $$\{0, 1, \ldots, L-1\} = \bigcup_{j=0}^{M-1} E_j = \bigcup_{j=0}^{M-1} \hat{E}_j \text{ to } Z_C$$

by $$\mathcal{M}: x \mapsto \left(x + \eta_{\lfloor \frac{x}{qM} \rfloor}\right) \bmod C \quad \text{(EQ-11)}$$

Theorem 1 $\mathcal{M}$ is a contention-free mapping.

Proof of this theorem is given in Appendix. In the following, examples will be given.

Example 3 Let L=24, C=4. Then M=6. Let P=7. Define $$\pi(j) = \begin{cases} jP \bmod L & \text{if } j = 0 \bmod 4 \\ (jP+4) \bmod L & \text{if } j = 1 \bmod 4 \\ (jP+4P+4) \bmod L & \text{if } j = 2 \bmod 4 \\ (jP+4P+4) \bmod L & \text{if } j = 3 \bmod 4 \end{cases} \quad \text{(EQ-12)}$$

We have $m=M \bmod C=2$ and $q=\text{ord}_C(m)=2$. Thus $$E_i=\{i, 6+i, 12+i, 18+i\}, i=0, \ldots, 5 \text{ and}$$

$E_{i,0} \bmod C = \{i \bmod 4, (2+i) \bmod 4\}$, $E_{i,1} \bmod C = \{i \bmod 4, (2+i) \bmod 4\}$ Since qM=12, the following results:

$$\left\lfloor \frac{i}{qM} \right\rfloor = 0, \left\lfloor \frac{(6+i)}{qM} \right\rfloor = 0, \left\lfloor \frac{(12+i)}{qM} \right\rfloor = 1, \left\lfloor \frac{(18+i)}{qM} \right\rfloor = 1$$

Take $\eta_j=j, j=0,1$ the following results:

$$\mathcal{M}(E_i)=\{i \bmod 4, (2+i) \bmod 4, (1+i) \bmod 4, (3+i) \bmod 4\}=Z_4.$$

Thus $\mathcal{M}$ is a contention-free map on $E_i$.

On the other hand, there is $$\{0, 1, \ldots, L-1\} = \bigcup_{i=0}^{5} \hat{E}_i.$$

Consider all 6 cases.

1) $\hat{E}_0 = \{\pi(0), \pi(6), \pi(12), \pi(18)\} =$
$\{0, 2, 12, 14\}$ with $\hat{E}_0 \bmod C = \{0, 2, 0, 2\}$ and $\left\lfloor \frac{\pi(0)}{qM} \right\rfloor = 0,$ $$\left\lfloor \frac{\pi(102)}{qM} \right\rfloor = 0, \left\lfloor \frac{\pi(204)}{qM} \right\rfloor = 1, \left\lfloor \frac{\pi(306)}{qM} \right\rfloor = 1$$

Thus $\mathcal{M}(\hat{E}_0)=\{0,2,1,3\}$, i.e. contention-free on $\hat{E}_0$.

2) $\hat{E}_1 = \{\pi(1), \pi(7), \pi(13), \pi(19)\} =$
$\{11, 9, 23, 21\}$ with $\hat{E}_1 \bmod C = \{3, 1, 3, 1\}$ and $\left\lfloor \frac{\pi(1)}{qM} \right\rfloor = 0,$ $$\left\lfloor \frac{\pi(7)}{qM} \right\rfloor = 0, \left\lfloor \frac{\pi(13)}{qM} \right\rfloor = 1, \left\lfloor \frac{\pi(19)}{qM} \right\rfloor = 1$$

Thus $\mathcal{M}(\hat{E}_1)=\{3,1,0,2\}$, i.e. contention-free on $\hat{E}_1$.

3) $\hat{E}_2 = \{\pi(2), \pi(8), \pi(14), \pi(20)\} =$
$\{22, 8, 10, 20\}$ with $\hat{E}_2 \bmod C = \{2, 0, 2, 0\}$ and $\left\lfloor \frac{\pi(2)}{qM} \right\rfloor = 1,$ $$\left\lfloor \frac{\pi(8)}{qM} \right\rfloor = 0, \left\lfloor \frac{\pi(14)}{qM} \right\rfloor = 0, \left\lfloor \frac{\pi(20)}{qM} \right\rfloor = 1$$

Thus $\mathcal{CM}(\hat{E}_2)=\{3,0,2,1\}$, i.e. contention-free on $\hat{E}_2$ $$\hat{E}_3 = \{\pi(3), \pi(9), \pi(15), \pi(21)\} = \qquad (4)$$

$\{5, 19, 17, 7\}$ with $\hat{E}_3 \bmod C = \{1, 3, 1, 3\}$ and $\left\lfloor \dfrac{\pi(3)}{qM} \right\rfloor = 0$, $$\left\lfloor \frac{\pi(105)}{qM} \right\rfloor = 1, \left\lfloor \frac{\pi(207)}{qM} \right\rfloor = 1, \left\lfloor \frac{\pi(309)}{qM} \right\rfloor = 0$$

Thus $\mathcal{CM}(\hat{E}_3)=\{1,0,2,3\}$, i.e. contention-free on $\hat{E}_3$ $$\hat{E}_4 = \{\pi(4), \pi(10), \pi(16), \pi(22)\} = \qquad (5)$$

$\{4, 6, 16, 18\}$ with $\hat{E}_4 \bmod C = \{0, 2, 0, 2\}$ and $\left\lfloor \dfrac{\pi(4)}{qM} \right\rfloor = 0$, $$\left\lfloor \frac{\pi(10)}{qM} \right\rfloor = 0, \left\lfloor \frac{\pi(16)}{qM} \right\rfloor = 1, \left\lfloor \frac{\pi(22)}{qM} \right\rfloor = 1$$

Thus $\mathcal{CM}(\hat{E}_4)=\{0,2,1,3\}$, i.e. contention-free on $\hat{E}_4$ $$\hat{E}_5 = \{\pi(5), \pi(11), \pi(17), \pi(23)\} = \qquad (6)$$

$\{15, 13, 3, 1\}$ with $\hat{E}_5 \bmod C = \{3, 1, 3, 1\}$ and $\left\lfloor \dfrac{\pi(5)}{qM} \right\rfloor = 1$, $$\left\lfloor \frac{\pi(11)}{qM} \right\rfloor = 1, \left\lfloor \frac{\pi(17)}{qM} \right\rfloor = 0, \left\lfloor \frac{\pi(23)}{qM} \right\rfloor = 0$$

Thus $\mathcal{CM}(\hat{E}_5)=\{0,2,3,1\}$, i.e. contention-free on $\hat{E}_5$.

Example 4 (Mapping from reference [3]) L=5472, C=12, P=97. Then M=456 and m=M mod C=0. Thus q=ord(m)=1. Then $E_i=\{456r+i|r=0,\ldots,11\}$, $i=0,\ldots,455$ with $E_i \bmod C=\{i\}$. Moreover, $$\left\lfloor \frac{(rM+i)}{M} \right\rfloor = r, r = 0, \ldots, 11.$$

Take $\eta_j=j, j=0,\ldots,11$, then, $\mathcal{CM}(E_i)=\{(i+j)\bmod 12|j=0,\ldots,11\}=Z_{12}$. Therefore $\mathcal{CM}$ is a contention-free map on $E_i$.

On the other hand, considering the following $\pi(rM+i)=[(rM+i)P+A(i \bmod C)P+B(i \bmod C)] \bmod L$ with A(i mod C)P+B (i mod C) defined in the following table, where it is supposed that i mod C=$k_i$.

| k | A(i mod C)P +B(i mod C) |
|---|---|
| 0, 8 | 0 |
| 1 | 24 |
| 2, 6 | 4P + 16 = 404 |
| 3, 11 | 4P + 24 + 12P + 12 = 1588 |
| 4 | 12P + 12 = 1176 |
| 5, 9 | 24 + 12P + 12 = 1200 |
| 7 | 4P + 24 = 412 |
| 10 | 4P + 16 + 12P + 12 = 1580 |

Thus, by M mod C=0, $\pi(rM+i) \bmod C=[iP+A(i)P+B(i)] \bmod C$. Therefore, $\hat{E}_i \bmod C=\{\pi(rM+i) \bmod C|r=0,\ldots,C-1\}=\{[iP+A(i)P+B(i)]\bmod C\}$, $\pi(rM+i)=[rMP+iP+A(i)P+B(i)] \bmod CM=[rM+iP+A(i)P+B(i)] \bmod CM$ Let $\pi(i)=(C-k)M+\gamma(i)$ with $0\leq\gamma<M$, then the following results $\pi(jM+i)=(C-k+j)M+\gamma(i), j=0,\ldots,k-1$ and $\pi(jM+i)=(j-k)M+\gamma(i), j=k,\ldots,C-1$ Thus $$\left\{\left\lfloor \frac{\pi(rM+i)}{M} \right\rfloor \bmod C \,\Big|\, r=0,\ldots C-1\right\} = \{0,1,\ldots,C-1\}.$$

Therefore, $$\mathcal{CM}(\hat{E}_i) =$$

$$\left\{\left(\left\lfloor \frac{\pi(rM+i)}{M} \right\rfloor + iP + A(i) + B(i)\right)\bmod C \,\Big|\, r=0,\ldots,C-1\right\} = Z_C.$$

Thus $\mathcal{CM}$ is a contention-free map on $\hat{E}_i$.

Example 5 (continue of Example 1) L=408=4*102 (C=4) with gcd(4,102)=2, i.e. M=102. Thus, m=M mod C=2, q=ord (m)=2 and $C_f$=2. Thus $E_i=\{i,102+e,204+i,306+i\}, i=0,\ldots,101$ $E_{i,0} \bmod C=\{i \bmod 4, (2+i) \bmod 4\}$, $E_{i,1} \bmod C=\{i \bmod 4, (2+i) \bmod 4\}$.

Since qM=204, the following results:

$$\left\lfloor \frac{i}{qM} \right\rfloor = 0, \left\lfloor \frac{(102+i)}{qM} \right\rfloor = 0, \left\lfloor \frac{(204+i)}{qM} \right\rfloor = 1, \left\lfloor \frac{(306+i)}{qM} \right\rfloor = 1$$

Take $\eta_j=j, j=0,1$, then
$\mathcal{CM}(E_i)=\{i \bmod 4, (2+i) \bmod 4, (1+i) \bmod 4, (3+i) \bmod 4\}$.
Thus $\mathcal{CM}$ is a contention-free map on $E_i$.

On the other hand, according to reference [3], P=43, θ=0, A(0)=A(1)=0, A(2)=A(3)=4 and B(0)=0, B(1)=B(2)=B(3)=4. Thus $$\pi(j) = \begin{cases} jP \bmod L & \text{if } j = 0 \bmod 4 \\ (jP+4) \bmod L & \text{if } j = 1 \bmod 4 \\ (jP+4P+4) \bmod L & \text{if } j = 2 \bmod 4 \\ (jP+4P+4) \bmod L & \text{if } j = 3 \bmod 4 \end{cases}$$

Then $$\hat{E}_0 = \{\pi(0), \pi(102), \pi(204), \pi(306)\} = \qquad (1$$

$\{0, 74, 204, 278\}$ with $\hat{E}_0 \bmod C = \{0, 2, 0, 2\}$ and $\left\lfloor \dfrac{\pi(0)}{qM} \right\rfloor = 0$, $$\left\lfloor \frac{\pi(102)}{qM} \right\rfloor = 0, \left\lfloor \frac{\pi(204)}{qM} \right\rfloor = 1, \left\lfloor \frac{\pi(306)}{qM} \right\rfloor = 1$$

Thus $\mathcal{CM}(\hat{E}_0)=\{0,2,1,3\}$, i.e. contention-free on $\hat{E}_0$.

$$\hat{E}_1 = \{\pi(1), \pi(103), \pi(205), \pi(307)\} = \{43, 117, 251, 321\} \qquad 2)$$

with $\hat{E}_1 \bmod C = \{3, 1, 3, 1\}$ and

-continued $$\left\lfloor \frac{\pi(1)}{qM} \right\rfloor = 0, \left\lfloor \frac{\pi(103)}{qM} \right\rfloor = 0, \left\lfloor \frac{\pi(205)}{qM} \right\rfloor = 1, \left\lfloor \frac{\pi(307)}{qM} \right\rfloor = 1$$

Thus $\mathcal{M}(\hat{E}_1) = \{3,1,0,2\}$, i.e. contention-free on $\hat{E}_1$.

$$\hat{E}_2 = \{\pi(2), \pi(104), \pi(206), \pi(308)\} = \qquad 3)$$

$$\{262, 392, 58, 188\} \text{ with } \hat{E}_2 \bmod C = \{2, 0, 2, 0\} \text{ and } \left\lfloor \frac{\pi(2)}{qM} \right\rfloor = 1,$$

$$\left\lfloor \frac{\pi(104)}{qM} \right\rfloor = 1, \left\lfloor \frac{\pi(206)}{qM} \right\rfloor = 0, \left\lfloor \frac{\pi(308)}{qM} \right\rfloor = 0$$

Thus $\mathcal{M}(\hat{E}_2) = \{3,1,2,0\}$, i.e. contention-free on $\hat{E}_2$.
. . . .

$$\hat{E}_{96} = \{\pi(96), \pi(198), \pi(300), \pi(402)\} = \qquad 97)$$

$$\{48, 252, 122, 326\} \hat{E}_{96} \bmod C = \{0, 0, 2, 2\} \text{ and } \left\lfloor \frac{\pi(96)}{qM} \right\rfloor = 0,$$

$$\left\lfloor \frac{\pi(198)}{qM} \right\rfloor = 1, \left\lfloor \frac{\pi(300)}{qM} \right\rfloor = 0, \left\lfloor \frac{\pi(402)}{qM} \right\rfloor = 1$$

Thus $\mathcal{M}(\hat{E}_{96}) = \{0,1,2,3\}$, i.e. contention-free on $\hat{E}_{96}$.
. . . .

Example 6 (Mapping from reference [4]) L=320=4*80 (C=4) with gcd(C,80)=4, i.e. M=80. Thus, m=M mod C=0, q=ord(m)=1 and $C_f$=C=4. Thus
$E_i = \{i, 80+i, 160+i, 240+i\}$, i=0, . . . , 79 and $E_i$ mod C={i mod 4}. Since qM=80, the following results:

$$\left\lfloor \frac{i}{qM} \right\rfloor = 0, \left\lfloor \frac{(80+i)}{qM} \right\rfloor = 1, \left\lfloor \frac{(160+i)}{qM} \right\rfloor = 2, \left\lfloor \frac{(240+i)}{qM} \right\rfloor = 3$$

Take $\eta_j = j, j=0,1,2,3$, the following results:
$\mathcal{M}(E_i) = \{i \bmod 4, (1+i) \bmod 4, (2+i) \bmod 4, (3+i) \bmod 4\}$.

Thus $\mathcal{M}$ is a contention-free map on $E_i$.

On the other hand, according to reference [4], P=197, θ=3, A(0)=A(1)=0, A(2)=A(3)=4 and B(0)=0,B(1)=8,B(2)=20, B(3)=12. Thus $$\pi(j) = \begin{cases} (jP + 3) \bmod L & \text{if } j = 0 \bmod 4 \\ (jP + 8 + 3) \bmod L & \text{if } j = 1 \bmod 4 \\ (jP + 4P + 20 + 3) \bmod L & \text{if } j = 2 \bmod 4 \\ (jP + 4P + 12 + 3) \bmod L & \text{if } j = 3 \bmod 4 \end{cases}$$

Then $$\hat{E}_0 = \{\pi(0), \pi(80), \pi(160), \pi(240)\} = \qquad 1)$$

$$\{3, 83, 163, 243\} \text{ with } \hat{E}_0 \bmod C = \{3, 3, 3, 3\} \text{ and } \left\lfloor \frac{\pi(0)}{qM} \right\rfloor = 0,$$

$$\left\lfloor \frac{\pi(80)}{qM} \right\rfloor = 1, \left\lfloor \frac{\pi(160)}{qM} \right\rfloor = 2, \left\lfloor \frac{\pi(204)}{qM} \right\rfloor = 3$$

Thus $\mathcal{M}(\hat{E}_0) = \{3,0,1,2\}$, i.e. contention-free on $\hat{E}_0$.

2)  $\hat{E}_1 = \{\pi(1), \pi(81), \pi(161), \pi(241)\} = \{208, 288, 48, 128\}$ with $$\hat{E}_1 \bmod C = \{0, 0, 0, 0\} \text{ and } \left\lfloor \frac{\pi(1)}{qM} \right\rfloor = 2,$$

$$\left\lfloor \frac{\pi(81)}{qM} \right\rfloor = 3, \left\lfloor \frac{\pi(161)}{qM} \right\rfloor = 0, \left\lfloor \frac{\pi(241)}{qM} \right\rfloor = 1$$

Thus $\mathcal{M}(\hat{E}_1) = \{2,3,0,1\}$, i.e. contention-free on $\hat{E}_1$.

$$\hat{E}_2 = \{\pi(2), \pi(82), \pi(162), \pi(242)\} = \qquad 3)$$

$$\{245, 5, 85, 165\} \text{ thus } \hat{E}_2 \bmod C = \{1, 1, 1, 1\} \text{ and } \left\lfloor \frac{\pi(2)}{qM} \right\rfloor = 3,$$

$$\left\lfloor \frac{\pi(82)}{qM} \right\rfloor = 0, \left\lfloor \frac{\pi(162)}{qM} \right\rfloor = 1, \left\lfloor \frac{\pi(242)}{qM} \right\rfloor = 2$$

Thus $\mathcal{M}(\hat{E}_2) = \{0,1,2,3\}$, i.e. contention-free on $\hat{E}_2$.

$$\hat{E}_3 = \{\pi(3), \pi(83), \pi(163), \pi(243)\} = \{114, 194, 274, 34\}, \qquad 4)$$

$$\text{thus } \hat{E}_3 \bmod C = \{2, 2, 2, 2\} \text{ and } \left\lfloor \frac{\pi(3)}{qM} \right\rfloor = 1,$$

$$\left\lfloor \frac{\pi(83)}{qM} \right\rfloor = 2, \left\lfloor \frac{\pi(163)}{qM} \right\rfloor = 3, \left\lfloor \frac{\pi(243)}{qM} \right\rfloor = 0$$

Thus $\mathcal{M}(\hat{E}_3) = \{3,0,1,2\}$, i.e. contention-free on $\hat{E}_3$.
. . . .

It is shown herein that for many block size the memory mappings given in reference [3], reference [4], and reference [2] are not contention-free for the interleave defined by ARP.

A general contention-free mapping for ARP of arbitrary block size is proposed. This mapping is algebraic and can be used in the 3GPP LTE turbo coding, among other coding types.

Figure 7:
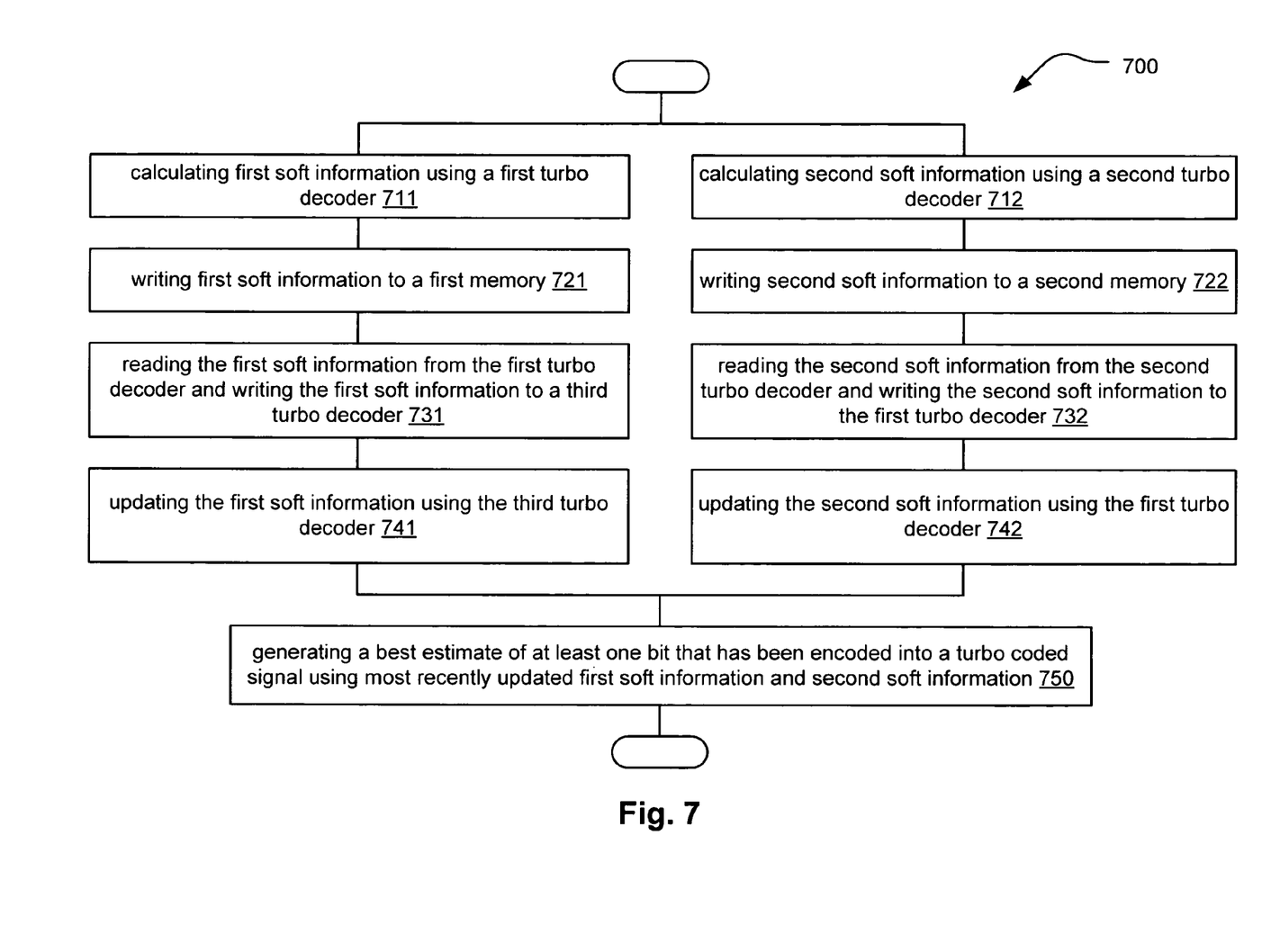
FIG. 7 illustrates an embodiment of a method for performing parallel decoding of turbo coded signals that employs contention-free memory mapping.

FIG. 7 illustrates an embodiment of a method 700 for performing parallel decoding of turbo coded signals that employs contention-free memory mapping. As shown in blocks 711 and 712, calculating of first soft information and second soft information can be performed using a first turbo decoder and a second turbo decoder. The first turbo decoder and the second turbo decoder can be implemented as parallel arranged turbo decoders. Then, as shown in blocks 721 and 722, the method 700 continues by writing the calculated first soft information and the second soft information to a first memory and a second memory. The first memory and the second memory can be implemented as parallel arranged memories.

Thereafter, the method 700 continues by reading the first soft information from the first turbo decoder and writing the first soft information to a third turbo decoder, as shown in a block 731. The method 700 also continues by reading the second soft information from the second turbo decoder and writing the second soft information to the first turbo decoder, as shown in a block 732. Each memory is accessed by only one turbo decoder at a time within the method 700.

Thereafter, the method 700 continues by updating the first soft information using the third turbo decoder, as shown in a block 741, and the method 700 continues by updating the second soft information using the first turbo decoder, as shown in a block 742.

After performing a final turbo decoding iteration, the method 700 involves generating a best estimate of at least one bit that has been encoded into a turbo coded signal using the most recently updated first soft information and second soft information, as shown in a block 750.

The present invention has also been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claimed invention.

The present invention has been described above with the aid of functional building blocks illustrating the performance of certain significant functions. The boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality. To the extent used, the flow diagram block boundaries and sequence could have been defined otherwise and still perform the certain significant functionality. Such alternate definitions of both functional building blocks and flow diagram blocks and sequences are thus within the scope and spirit of the claimed invention.

One of average skill in the art will also recognize that the functional building blocks, and other illustrative blocks, modules and components herein, can be implemented as illustrated or by discrete components, application specific integrated circuits, processors executing appropriate software and the like or any combination thereof.

Moreover, although described in detail for purposes of clarity and understanding by way of the aforementioned embodiments, the present invention is not limited to such embodiments. It will be obvious to one of average skill in the art that various changes and modifications may be practiced within the spirit and scope of the invention, as limited only by the scope of the appended claims.

REFERENCES

[1] A. Tarable, S. Benedetto and G. Montorsi "Mapping Interleaving Laws to Parallel Turbo and LDPC Decoder Architectures," *IEEE Transactions on Information Theory*, Vol. 50, No. 9, pp. 2002-2009, September 2004.

[2] A. Nimbalker, T. E. Fuja, D. J. Costello, Jr., T. K. Blankenship and B. Classon, "Contention-Free Interleavers," *IEEE ISIT* 2004, Chicago, USA, Jun. 27-Jul. 2, 2004.

[3] C. Berrou, Y. Saouter, C. Douillard, S. Kerouédan, and M. Jézéquel, "Designing good permutations for turbo codes: towards a single model," 2004 *IEEE International Conference on Communications (ICC)*, Vol.: 1, pp: 341-345, 20-24 Jun. 2004.

[4] France Telecom, GET, Enhancement of Rel. 6 Turbo Code, 3GPP TSG RAN WG1#43, R1-051310, 2005.

APENDIX: Proof of Theorem 1

Without loss of generality, in the following proof it is assumed that $\eta_i = i$ for $i=0, \ldots, C_f-1$. Also, the following definition is employed:

$x \oplus y = (x+y) \mod C$ and $X \mod C = \{x \mod C | x \in X\}$ for any integer subset.

Before proving the theorem, two lemmas are introduced. Define a set $$G(m) = \{0, m, \ldots, (q-1)m\} \quad \text{(EQ-A1)}$$

where q is the order of m (as well as M). Then G(m) is a subgroup of $Z_C$.

Lemma 1 Let $H_j = \{h_0^{(j)}, h_1^{(j)}, \ldots, h_{q-1}^{(j)}\}$, $j = 0, \ldots, C_f-1$ be subsets of non-negative integers such that $H_j \mod C = \alpha \oplus G(m)$ where $\alpha \in Z_C$. Let $\delta_0, \delta_1, \ldots, \delta_{C_f-1} \in Z_C$ that $\{\delta_0, \ldots, \delta_{C_f-1}\} = \{0, 1, \ldots, C_f-1\}$. Define $H_j + \delta_j = \{h_0^{(j)} + \delta_j, \ldots, h_{q-1}^{(j)} + \delta_j\}$. Then a) The sets $(H_0 + \delta_0) \mod C, (H_1 + \delta_1) \mod C, \ldots, (H_{C_f-1} + \delta_{C_f-1}) \mod C$ are disjoint; and b) $\{(H_0 + \delta_0) \mod C\} \cup \{(H_1 + \delta_1) \mod C\} \cup \ldots \cup \{(H_{C_f-1} + \delta_{C_f-1}) \mod C\} = Z_C$ Proof: It is easy to see that $(H_j + \delta_j) \mod C = (\alpha \oplus \delta_j) \oplus G(m)$. Assume a) of the proposition is not true, then there exist two distinct integers u, v, $0 \leq v, u < C_f$ such that $\delta_u > \delta_v$ and $(\alpha \oplus \delta_u) \oplus G(m)$ and $(\alpha \oplus \delta_v) \oplus G(m)$ are not disjoint. Then there exist $s, t \in \{0, \ldots, q-1\}$ such that $s \neq t$ but $(\alpha \oplus \delta_u) \oplus sm = (\alpha \oplus \delta_v) \oplus tm$. This implies $\delta_u - \delta_v = (t-s)m \mod C$ which is equivalent to $(\delta_u - \delta_v)q = 0 \mod C$ s. Thus $\delta_u = \delta_v$. This contradicts to the assumption on u,v. Therefore, a) is correct. b) of the proposition is a direct consequence of a) and the fact that every set in a) has q elements in $Z_C$.

Lemma 2 If $s_1 \neq s_2$ then $$\left\lfloor \frac{\pi((s_1 q + r)M + i)}{qM} \right\rfloor \neq \left\lfloor \frac{\pi((s_2 q + r)M + i)}{qM} \right\rfloor.$$

Proof: Since for any $s \in \{0, \ldots, C_f-1\}$, $[(sq+r)M+i] \mod C = (rM+i) \mod C$, we can define $\lambda_{i,r} = [(sq+r)M+i] \mod C$ for every $s \in \{0, \ldots, C_f-1\}$. Since $\pi(u) = \{uP + A(u \mod C)P + B(u \mod C) + \theta\} \mod CM$ we have $\hat{E}_{i,s} = \{[(sq+r)M+i]P + \Omega(\lambda_{i,r}) + \theta | r = 0, \ldots, q-1\}$ where $\omega(\lambda_{i,r}) = A(\lambda_{i,r})P + B(\lambda_{i,r})$. Assume the lemma is not true, say $$\left\lfloor \frac{\pi((s_1 q + r)M + i)}{qM} \right\rfloor = \left\lfloor \frac{\pi((s_2 q + r)M + i)}{qM} \right\rfloor = s$$

for some $s \in \{0, \ldots, C_f-1\}$. Then there exist $0 \leq r_j < q$, $0 \leq i_j < M$ for $j = 1, 2$ such that $\pi((s_j q + r) M + i) = [(s_j q + r)M + i]P + \omega(\lambda_{i,r}) + \theta - A_j CM = (sq + r_j)M + i_j$.

Subtracting these two equations results with $(s_1 - s_2)q MP - (A_1 - A_2)CM = (r_1 - r_2)M + (i_1 - i_2)$ \quad (EQ-A1)

This implies $M | (i_1 - i_2)$. Therefore $i_1 = i_2$. Now (EQ-A1) becomes $(s_1 - s_2)qP - (A_1 - A_2)C = (r_1 - r_2)$ This implies $q | (r_1 - r_2)$ since $q | C$. Thus $r_1 = r_2$. Therefore $\pi((s_1 q + r)M + i) = \pi((s_2 q + r)M + i)$ which contradicts the fact that $\pi$ is a permutation and $(s_1 q + r)M + i \neq (s_2 q + r)M + i$.

The proof of Theorem 1 will be divided to two parts.

Part I: for $i = 0, \ldots, M-1$, and $j \neq j'$, $j, j' \in E_i \Rightarrow \mathcal{M}(j) \neq \mathcal{M}(j')$.

Part II: for $i = 0, \ldots, M-1$ and $j \neq j'$, $j, j' \in \hat{E} \Rightarrow \mathcal{M}(j) \neq \mathcal{M}(j')$.

Proof of Part I: By the definition in (EQ-10), $E_{i,s}$ mod C=(i mod C)⊕G(m). Thus $$\mathcal{M}(E_{i,s}) = ((s+i) \mod C) \oplus G(m).$$

Since i mod C, (1+i) mod C, . . . , $(C_f-1+i)$ mod C are distinct, by Lemma 1 this proves $\mathcal{M}(E_{i,0})$, $\mathcal{M}(E_{i,1})$, . . . , $\mathcal{M}(E_{i,C_f-1})$ are distinct $C_f$ sets and $$\bigcup_{s=0}^{C_f-1} \mathcal{M}(E_{i,s}) = Z_C.$$

Thus $$\mathcal{M}(E_i) = \mathcal{M}\left(\bigcup_{s=0}^{C_f} E_{i,s}\right) = \bigcup_{t=0}^{C_f} \mathcal{M}(E_{i,s}) = \{0, \ldots, C-1\}.$$

This proves that the memory mapping $\mathcal{M}$ on $E_i$ is one to one and on to since $\|E_i\|=C$. This proves the first part of Theorem 1.

Proof of Part II: Consider the sets $\hat{E}_{i,s} = \{\pi((sq+r)M+i) | r=0, \ldots, q-1\}$, $0 \leq s < C_f$, $0 \leq i < M$. For $r \in \{0, \ldots, q-1\}$, $i \in \{0, \ldots, M-1\}$ define $$a_{s,r,i} = \left\lfloor \frac{\pi((sq+r)M+i)}{qM} \right\rfloor$$

then Lemma 2 shows $\alpha_{0,r,i}, \ldots, \alpha_{C_f-1,r,i}$ are distinct. Since $\pi((sq+r)M+i) < qC_fM$ we have $\alpha_{s,r,i} < C_f$. Thus $$\{\alpha_{0,r,i}, \ldots \alpha_{C_f-1,r,i}\} = \{0, \ldots, C_f-1\}.$$

Therefore, given a $t \in \{0, \ldots, C_f-1\}$ there exist $s_{t,0}$, $s_{t,1}, \ldots, s_{t,q-1}$ such that s $$\alpha_{s_{t,0},0,i} = \alpha_{s_{t,1},1,i} = \ldots = \alpha_{s_{t,q-1},q-1,i} = t$$

Define $F_{i,t} = \{\pi((s_{t,r}q+r)M+i) | r=0, \ldots, q-1\}$, then the result is $$\bigcup_{t=0}^{C_f} F_{i,t} = \bigcup_{s=0}^{C_f} \hat{E}_{i,s} = \hat{E}_i.$$

Moreover, since $(s_{t,r}q+r)M+i=rM+i$ mod C the following result is provided, $$[(s_{t,r}q+r)M+i] \mod C = \{[(s_{t,r'}q+r')M+i] \mod C\} \mod m.$$

for any r, r'∈{0, . . . , C−1}. Then, by (EQ-7) in the definition of the general ARP, the following relationship results $$[A(((s_{t,r}q+r)M+i) \mod C)P+B((s_{t,r}q+r) M+i) \mod C)]$$
$$\mod C=[A(((s_{t,r'}q+r') M+i) \mod C) P+B((s_{t,r'}q+r') M+i) \mod C)] \mod C$$

for any r,r'∈{0, . . . , C−1}. This value is defined by φ(m,i). Then $F_{i,t}$ mod C=G(mP)⊕(iP+φ(m,i)+θ) mod C with $\text{ord}_C$ (mP)=$\text{ord}_C$(m)=q since gcd(P,C)=1. Since $$\mathcal{M}(\pi((sq+r)M+i)) = [\pi((sq+r)M+i) + \alpha_{s,r,i}] \mod C = ((rm+i)P + \phi(m,i) + \theta + \alpha_{s,r,i}) \mod C$$

we have $\mathcal{M}(F_{i,t})$=G(mP)⊕⊕(iP+φ)(m,i)+θ) mod C=t⊕$F_{i,t}$ mod C. Thus, by Lemma 1, $\mathcal{M}(F_{i,0})$, . . . , $\mathcal{M}(F_{i,C_f-1})$ are distinct and $$\bigcup_{t=0}^{C_f} \mathcal{M}(F_{i,t}) = \{0, \ldots, C-1\}.$$

Therefore $$\mathcal{M}(\hat{E}_i) = \mathcal{M}\left(\bigcup_{s=0}^{C_f} \hat{E}_{i,s}\right) = \mathcal{M}\left(\bigcup_{t=0}^{C_f} F_{i,t}\right) = \bigcup_{t=0}^{C_f} \mathcal{M}(F_{i,t}) = \{0, \ldots, C-1\}.$$

That means the memory mapping $\mathcal{M}$ on the set $\hat{E}_i$ is one to one and on to since $\|\hat{E}_i\|=C$. This proves the second part of Theorem 1.

What is claimed is:

1. A decoder that is operable to perform parallel decoding of a turbo coded signal having a block length L that includes a plurality of sub-blocks each having length M, the decoder comprising:
   a plurality of turbo decoders that includes C turbo decoders;
   a plurality of memories that includes C memories; and
   a processing module that is operable to perform contention-free memory mapping between the plurality of turbo decoders and the plurality of memories during iterative decoding processing of the turbo coded signal; and wherein:
   the plurality of turbo decoders is operable to read from and write to the plurality of memories;
   q is a smallest positive integer for which the term, (q·M)/C, results in an integer;
   $C_f$ is C/q;
   a set, η, has a same number of elements as $C_f$, and each element $η_i$ within the set, η, corresponds to only one distinct value between 0 and $C_f-1$;
   a symbol having an index, x, of the turbo coded signal is mapped into a memory of the plurality of memories that has an index of $$(x + \eta_{\lfloor \frac{x}{qM} \rfloor})$$

mod C; and
   the plurality of turbo decoders is operable to generate a best estimate of at least one bit that has been encoded into the turbo coded signal.

2. The decoder of claim 1, wherein:
during turbo encoding that generates the turbo coded signal, the turbo coded signal undergoes ARP (almost regular permutation).

3. The decoder of claim 1, wherein:
the memory mapping performed by the processing module is a function of:
a number of parallel arranged turbo decoders, C, within the plurality of turbo decoders;
a ratio, M, that is the length of each sub-block of the plurality of sub-blocks and is a ratio of the block length, L, of the turbo coded signal divided by C; and
the processing module ensures each symbol of the turbo coded signal is read from an appropriate memory of the plurality of memories and is provided to an appropriate turbo decoder of the plurality of turbo decoders.

4. The decoder of claim 1, wherein:
each turbo decoder of the plurality turbo decoders accesses only one memory of the plurality of memories at a time.

5. The decoder of claim 1, wherein:
during a first time, the processing module is operable to connect the plurality of turbo decoders to the plurality of memories according to a first contention-free memory mapping;
during a second time, the processing module is operable to connect the plurality of turbo decoders to the plurality of memories according to a second contention-free memory mapping; and
each turbo decoder of the plurality turbo decoders accesses only one memory of the plurality of memories during each of the first time and the second time.

6. The decoder of claim 1, wherein:
the turbo coded signal is a first turbo coded signal having a first block length;
the decoder is operable to decode the first turbo coded signal having the first block length; and
the decoder is operable to decode a second first turbo coded signal having a second block length.

7. The decoder of claim 1, wherein:
when decoding the turbo coded signal, each turbo decoder of the plurality of turbo decoders is operable to update a soft estimate of at least one symbol that has been encoded into the turbo coded signal.

8. The decoder of claim 1, wherein:
during a first time, the processing module is operable to:
enable a first turbo decoder of the plurality of turbo decoders to write first soft information to a first memory of the plurality of memories; and
enable a second turbo decoder of the plurality of turbo decoders to write second soft information to a second memory of the plurality of memories; and
during a second time, the processing module is operable to enable the first turbo decoder to read the second soft information from the second memory.

9. The decoder of claim 1, wherein:
during a first time, a first turbo decoder of the plurality of turbo decoders is operable to write soft information to a first memory of the plurality of memories; and
during a second time, a second turbo decoder of the plurality of turbo decoders is operable to read the soft information from the first memory.

10. The decoder of claim 1, wherein:
the decoder performs a plurality of decoding iterations;
each turbo decoder of the plurality of turbo decoders updates soft information during each decoding iteration of the plurality of decoding iterations; and
during a final decoding iteration of the plurality of decoding iterations, the plurality of turbo decoders is operable to generate the best estimate of the at least one bit that has been encoded into the turbo coded signal using most recently updated soft information.

11. The decoder of claim 1, wherein:
the decoder is implemented within a communication device; and
the communication device is implemented within at least one of a satellite communication system, a wireless communication system, a wired communication system, and a fiber-optic communication system.

12. A decoder that is operable to perform parallel decoding of a turbo coded signal having a block length L that includes a plurality of sub-blocks each having length M, the decoder comprising:

a plurality of turbo decoders that includes C turbo decoders;
a plurality of memories that includes C memories; and
a processing module that is operable to perform contention-free memory mapping between the plurality of turbo decoders and the plurality of memories during iterative decoding processing of the turbo coded signal; and wherein:
the plurality of turbo decoders is operable to read from and write to the plurality of memories;
q is a smallest positive integer for which the term, $(q \cdot M)/C$, results in an integer;
$C_f$ is $C/q$;
a set, $\eta$, has a same number of elements as $C_f$, and each element $\eta_i$ within the set, $\eta$, corresponds to only one distinct value between 0 and $C_f-1$;
a symbol having an index, x, of the turbo coded signal is mapped into a memory of the plurality of memories that has an index of $$(x + \eta_{\lfloor \frac{x}{qM} \rfloor})$$

mod C;
during a first time, the processing module is operable to:
enable a first turbo decoder of the plurality of turbo decoders to write first soft information to a first memory of the plurality of memories; and
enable a second turbo decoder of the plurality of turbo decoders to write second soft information to a second memory of the plurality of memories;
during a second time, the processing module is operable to enable the first turbo decoder to read the second soft information from the second memory;
each turbo decoder of the plurality turbo decoders accesses only one memory of the plurality of memories at a time; and
the plurality of turbo decoders is operable to generate a best estimate of at least one bit that has been encoded into the turbo coded signal.

13. The decoder of claim 12, wherein:
the turbo coded signal is a first turbo coded signal having a first block length;
the decoder is operable to decode the first turbo coded signal having the first block length; and
the decoder is operable to decode a second first turbo coded signal having a second block length.

14. The decoder of claim 12, wherein:
during the second time, the processing module is operable to enable a third turbo decoder of the plurality of turbo decoders to read the first soft information from the first memory.

15. The decoder of claim 12, wherein:
the decoder performs a plurality of decoding iterations;
the first soft information and the second soft information is updated by at least one turbo decoder of the plurality of turbo decoders during each decoding iteration of the plurality of decoding iterations; and
during a final decoding iteration of the plurality of decoding iterations, the plurality of turbo decoders is operable to generate the best estimate of the at least one bit that has been encoded into the turbo coded signal using most recently updated soft information.

16. The decoder of claim 12, wherein:

the decoder is implemented within a communication device; and the communication device is implemented within at least one of a satellite communication system, a wireless communication system, a wired communication system, and a fiber-optic communication system.

17. A method for performing parallel decoding of a turbo coded signal having a block length L that includes a plurality of sub-blocks each having length M, the method comprising:

performing contention-free memory mapping between a plurality of turbo decoders, that includes C turbo decoders, and a plurality of memories, that includes C turbo memories, during iterative decoding processing of the turbo coded signal; calculating first soft information using a first turbo decoder of a plurality of turbo decoders;

calculating second soft information using a second turbo decoder of the plurality of turbo decoders;

writing the first soft information to a first memory of a plurality of memories, wherein:

q is a smallest positive integer for which the term, $(q \cdot M)/C$, results in an integer;

$C_f$ is $C/q$;

a set, $\eta$, has a same number of elements as $C_f$, and each element $\eta_i$ within the set, $\eta$, corresponds to only one distinct value between 0 and $C_f - 1$; and the first soft information corresponding to a symbol having an index, x, of the turbo coded signal is written into the first memory of the plurality of memories that has an index of $$(x + \eta_{\lfloor \frac{x}{qM} \rfloor}) \bmod C;$$

writing the second soft information to a second memory of the plurality of memories;

reading the first soft information from the first turbo decoder of the plurality of turbo decoders and writing the first soft information to a third turbo decoder of the plurality of turbo decoders;

reading the second soft information from the second turbo decoder of the plurality of turbo decoders and writing the second soft information to the first turbo decoder of the plurality of turbo decoders;

updating the first soft information using the third turbo decoder of the plurality of turbo decoders;

updating the second soft information using the first turbo decoder of the plurality of turbo decoders; and during a final decoding iteration of the iterative decoding processing of the turbo coded signal, generating a best estimate of at least one bit that has been encoded into the turbo coded signal using most recently updated first soft information and second soft information.

18. The method of claim 17, wherein:

the turbo coded signal is a first turbo coded signal having a first block length;

the method is operable to decode the first turbo coded signal having the first block length; and the method is operable to decode a second first turbo coded signal having a second block length.

19. The method of claim 17, further comprising:

with each turbo decoder of the plurality of turbo decoders, accessing only one memory of the plurality of memories at a time when reading soft information there from.

20. The method of claim 17, wherein:

the method is performed within a communication device; and the communication device is implemented within at least one of a satellite communication system, a wireless communication system, a wired communication system, and a fiber-optic communication system.

* * * * *